(12) United States Patent
Ganor

(10) Patent No.: US 7,247,971 B2
(45) Date of Patent: Jul. 24, 2007

(54) HIGH RESOLUTION PIEZOELECTRIC MOTOR

(75) Inventor: Ze'ev Ganor, Herzelia (IL)

(73) Assignee: Nanomotion Ltd, Yokneam (IL)

( * ) Notice: Subject to any disclaimer, the term of this patent is extended or adjusted under 35 U.S.C. 154(b) by 106 days.

(21) Appl. No.: 10/522,309

(22) PCT Filed: Jul. 23, 2003

(86) PCT No.: PCT/IL03/00603

§ 371 (c)(1),
(2), (4) Date: Oct. 6, 2005

(87) PCT Pub. No.: WO2004/012279

PCT Pub. Date: Feb. 5, 2004

(65) Prior Publication Data

US 2006/0113866 A1    Jun. 1, 2006

Related U.S. Application Data

(63) Continuation of application No. 10/206,717, filed on Jul. 25, 2002, now Pat. No. 7,061,158.

(51) Int. Cl.
*H01L 41/09* (2006.01)
*H02N 2/00* (2006.01)
(52) U.S. Cl. .................. 310/317; 310/316.01
(58) Field of Classification Search ........... 310/316.01, 310/317
See application file for complete search history.

(56) References Cited

U.S. PATENT DOCUMENTS 5,281,899 A    1/1994    Culp
5,453,653 A    9/1995    Zumeris
5,563,465 A    10/1996   Nakahara et al.
5,616,980 A    4/1997    Zumeris
5,640,063 A    6/1997    Zumeris et al.
6,064,140 A    5/2000    Zumeris
6,081,063 A    6/2000    Kasuga et al.
6,384,514 B1   5/2002    Slutskiy et al.
6,515,941 B1   2/2003    Suzuki et al.
6,617,759 B1   9/2003    Zumeris et al.
7,061,158 B2 * 6/2006    Ganor ........................ 310/317

FOREIGN PATENT DOCUMENTS

| EP | 0 313 072 | 4/1989 |
|----|-----------|--------|
| EP | 0 755 054 | 1/1997 |
| EP | 0938144   | 8/1999 |
| WO | WO 00/74153 | 12/2000 |

OTHER PUBLICATIONS

Mori, K. et al. "Ultrasonic linear motor for a high precision X—Y stage". IEEE 1989 Ultrasonics Symposium Proceedings, Montreal, Que. Canada. pp. 657-660.

* cited by examiner

*Primary Examiner*—Thomas M. Dougherty
(74) *Attorney, Agent, or Firm*—Eitan Law Group

(57) ABSTRACT

A piezoelectric motor for moving and positioning a load, the motor comprising: a piezoelectric vibrator having a plurality of electrodes and a coupling surface which is pressed to a load; and a power supply selectively operable to electrify at least one vibrator electrode with time varying voltage to generate vibrations in the coupling surface that step the load to a desired position or to electrify at least one vibrator electrode with DC voltage to displace the coupling surface and move thereby the load to a desired position, which DC voltage the power supply maintains to maintain the load at the desired position.

3 Claims, 6 Drawing Sheets

HIGH RESOLUTION PIEZOELECTRIC MOTOR

RELATED APPLICATIONS

The present application is a U.S. National Phase of PCT Application No. PCT/IL2003/000603, published as WO 2004/012279, filed on Jul. 23, 2003 and is a continuation-in-part of U.S. application Ser. No. 10/206,717, filed on Jul. 25, 2002 now U.S. Pat. No. 7,061,158.

FIELD OF THE INVENTION

The invention relates to piezoelectric motors and in particular to piezoelectric motors capable of moving an element and positioning the element at a desired location with a high degree of accuracy.

BACKGROUND OF THE INVENTION

Piezoelectric motors that are able to move a load from a first position to a second position relatively rapidly, even when moving the element requires translating and/or rotating the load by a relatively large distance and/or angle, are known in the art. Generally, such a piezoelectric motor comprises a piezoelectric vibrator having electrodes on surfaces thereon and a power supply that electrifies the electrodes with an AC voltage to generate high frequency elliptical vibrations in the vibrator. The vibrator has a coupling surface, often a "friction nub" formed from a relatively hard, wear resistant material mounted to a surface of the vibrator, which is resiliently pressed to a surface of a load that the motor moves.

To move the load, the power supply electrifies the electrodes to excite vibrations in the vibrator and as a result vibrations in the coupling surface. During each vibration cycle of the vibrator, vibratory motion of the coupling surface steps the load by a relatively small distance in a desired direction towards the second position. As a result of the high frequency of the vibrations, the motor moves the load by a large number of steps each second and thereby at a relatively high velocity.

However, there is often a need for such motors to be able to position a load that they move to an accuracy that is better than a small number of nanometers and controlling such motors to provide the required positioning accuracy is generally difficult. In addition, once a piezoelectric motor has positioned a load it is often required to reposition the load by moving it by accurately controlled nanometer distances equal to or less than a few nanometers or tens of nanometers or sub-nanometer distances. Controlling a piezoelectric motor to provide such performance is also generally difficult.

U.S. Pat. No. 5,616,980, the disclosure of which is incorporated herein by reference, describes electrifying electrodes of a piezoelectric motor with unipolar pulses to control the motor to accurately position a load at a desired location. U.S. application Ser. No. 09/980,375, the disclosure of which is incorporated herein by reference, describes controlling the step size of a piezoelectric motor by controlling motion of the motor's coupling surface perpendicular to the load independently of motion of the coupling surface parallel to the load to accurately position the load.

SUMMARY OF THE INVENTION

An aspect of some embodiments of the present invention relates to providing a high spatial resolution piezoelectric motor that can position a body to which it is coupled with nanometer or sub-nanometer spatial resolution.

An aspect of some embodiments of the present invention relates to providing a high spatial resolution piezoelectric motor that can move a load to which it is coupled relatively rapidly over relatively large distances to position the element at a desired location with nanometer or sub-nanometer spatial resolution.

A piezoelectric motor, in accordance with the present invention, comprises a piezoelectric vibrator, a power supply for electrifying electrodes of the vibrator with AC voltage and a power supply for electrifying vibrator electrodes with DC voltage. The motor, in accordance with an embodiment of the present invention, has at least one AC mode of operation and at least one DC mode of operation.

In an AC mode, in accordance with an embodiment of the present invention, the power supply electrifies electrodes of the vibrator with a time varying, optionally AC voltage to generate vibrations in a coupling surface of the vibrator that is pressed to a load whose motion the motor controls. The vibrations in the coupling surface step the load to a desired location and may be used to move the load at relatively high velocities and/or over relatively long distances.

In a DC mode, the power supply electrifies electrodes of the vibrator with DC voltage to displace the load from a first position by a distance controlled to relatively high resolution to position the load at a second position. The DC voltage distorts the shape of the vibrator, e.g. bends or elongates the vibrator. As the vibrator is distorted, the coupling surface moves and "drags" the load to which it is pressed along with it. A direction of the distortion and its magnitude is a function of polarity and magnitude of the DC voltage, which are controlled to displace the load by a displacement required to position the load at the second position. Once in position at the second position, in accordance with an embodiment of the present invention, the power supply maintains the DC voltage on the electrodes as long as required to maintain the vibrator distortion and thereby the load in the second position.

The inventor has found that DC voltage in a DC mode of a piezoelectric motor, in accordance with an embodiment of the present invention, can be controlled to control distance by which the coupling surface of the motor moves with a resolution equal to or better than a few nanometers. As a result, an amount by which a load is displaced from a first position to a second position, in accordance with an embodiment of the present invention, is also controlled to resolution equal to or better than a few a nanometers. In some embodiments of the present invention the amount by which the load is displaced is controlled to sub-nanometer resolution. In some embodiments of the present invention, for which appropriate controls are implemented to reduce environmental disturbances, such as for example vibrations and temperature fluctuations, that may affect motion control of the load, displacement may be controlled with a resolution better than a 100 picometers.

DC voltages applied to a piezoelectric motor in accordance with some embodiments of the present invention generate displacements of the motor's coupling surface that are substantially collinear and are used to move a load along a substantially same single direction. In some embodiments of the present invention, DC voltages applied to a piezoelectric motor are controlled to generate non-collinear displacements of the motor's coupling surface, which may be used to move a load along a first direction and/or along a second orthogonal direction.

It is noted that displacements along a given direction of a coupling surface of a piezoelectric motor operating in a DC mode, in accordance with an embodiment of the present invention, may be used not only to displace a load along the direction. The motor may of course be coupled to a load so that in a DC mode displacements of the motor's coupling surface generate angular displacements of the load about an axis.

There is therefore provided, in accordance with an embodiment of the present invention a piezoelectric motor for moving and positioning a load, the motor comprising: a piezoelectric vibrator having a plurality of electrodes and a coupling surface which is pressed to a load; and a power supply selectively operable to electrify at least one vibrator electrode with time varying voltage to generate vibrations in the coupling surface that step the load to a desired position or to electrify at least one vibrator electrode with DC voltage to displace the coupling surface and move thereby the load to a desired position, which DC voltage the power supply maintains to maintain the load at the desired position.

Optionally, displacements generated by DC voltage applied by the power supply are substantially collinear. Additionally or alternatively, the DC voltage is controllable to generate displacements that are not collinear.

In some embodiments of the present invention, the vibrator is formed in a shape of a rectangular plate having first and second parallel, relatively large face surfaces and long and narrow edge surfaces and wherein the plurality of electrodes comprises at least one electrode on each face surface.

Optionally, the at least one electrode on the first face surface comprises four quadrant electrodes each of which covers substantially all of a different quadrant of the face surface. Optionally, the at least one electrode on the second face surface comprises a single electrode that covers substantially all the area of the other face surface.

In some embodiments of the present invention, the coupling surface is a surface on a short edge surface of the vibrator.

The power supply optionally electrifies at least one quadrant electrode relative to the single electrode to bend the vibrator in its plane and displace thereby the coupling surface.

Alternatively, the power supply optionally electrifies quadrant electrodes along a same long edge surface with a DC voltage and quadrant electrodes along opposite long edges with opposite polarity voltage. Alternatively, the power supply optionally electrifies quadrant electrodes along a same long edge surface with a DC voltage and quadrant electrodes along opposite long edges are floating. Alternatively, the power supply optionally electrifies quadrant electrodes along a same diagonal with a same DC voltage and quadrant electrodes along different diagonals with opposite polarity voltage. Alternatively, the power supply optionally electrifies quadrant electrodes along one diagonal of the first surface with a DC voltage and quadrant electrodes along the other diagonal are floating. Alternatively, the power supply optionally electrifies quadrant electrodes along one diagonal of the first surface with a DC voltage and quadrant electrodes along the other diagonal are grounded. Optionally, the single electrode is grounded.

In some embodiments of the present invention, the vibrator is formed in the shape of a rectangular parallelepiped constructed from a plurality of thin rectangular layers of piezoelectric material bonded together, each layer having relatively large face surfaces and long and short edge surfaces, and wherein the plurality of electrodes comprises at least one electrode substantially contiguous with each face surface of the layers.

Optionally, the coupling surface is located on a short edge of the vibrator.

Additionally or alternatively, the power supply electrifies at least one configuration of electrodes with DC voltage to bend the vibrator in its plane and displace thereby the coupling surface. In some embodiments of the present invention, the power supply electrifies at least one configuration of electrodes with DC voltage to bend the vibrator perpendicular to its plane and displace thereby the coupling surface.

In some embodiments of the present invention, DC voltage is controlled to control magnitude of displacement of the coupling surface to resolution equal to or better than a 5 nanometers.

In some embodiments of the present invention, DC voltage is controlled to control magnitude of displacement of the coupling surface to resolution equal to or better than a 2 nanometers.

In some embodiments of the present invention, DC voltage is controlled to control magnitude of displacement of the coupling surface to resolution equal to or better than a 1 nanometer.

In some embodiments of the present invention, DC voltage is controlled to control magnitude of displacement of the coupling surface to resolution equal to or better than a 0.1 nanometer.

There is further provided, in accordance with an embodiment of the present invention, a piezoelectric actuator for moving and positioning a load, the actuator comprising: a piezoelectric body having a plurality of electrodes and a coupling surface which is pressed to a load to friction couple the body to the load; and a power supply operable to electrify at least one electrode of the plurality of electrodes with DC voltage to displace the coupling surface and drag thereby the load to a desired position, which DC voltage the power supply maintains to maintain the load at the desired position.

Optionally, displacements generated by the DC voltage applied by the power supply are substantially collinear. Additionally or alternatively, the DC voltage is controllable to generate displacements that are not collinear.

BRIEF DESCRIPTION OF FIGURES

Non-limiting examples of embodiments of the present invention are described below with reference to figures attached hereto and listed below. In the figures, identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION OF EXEMPLARY EMBODIMENTS

Figure 1A:
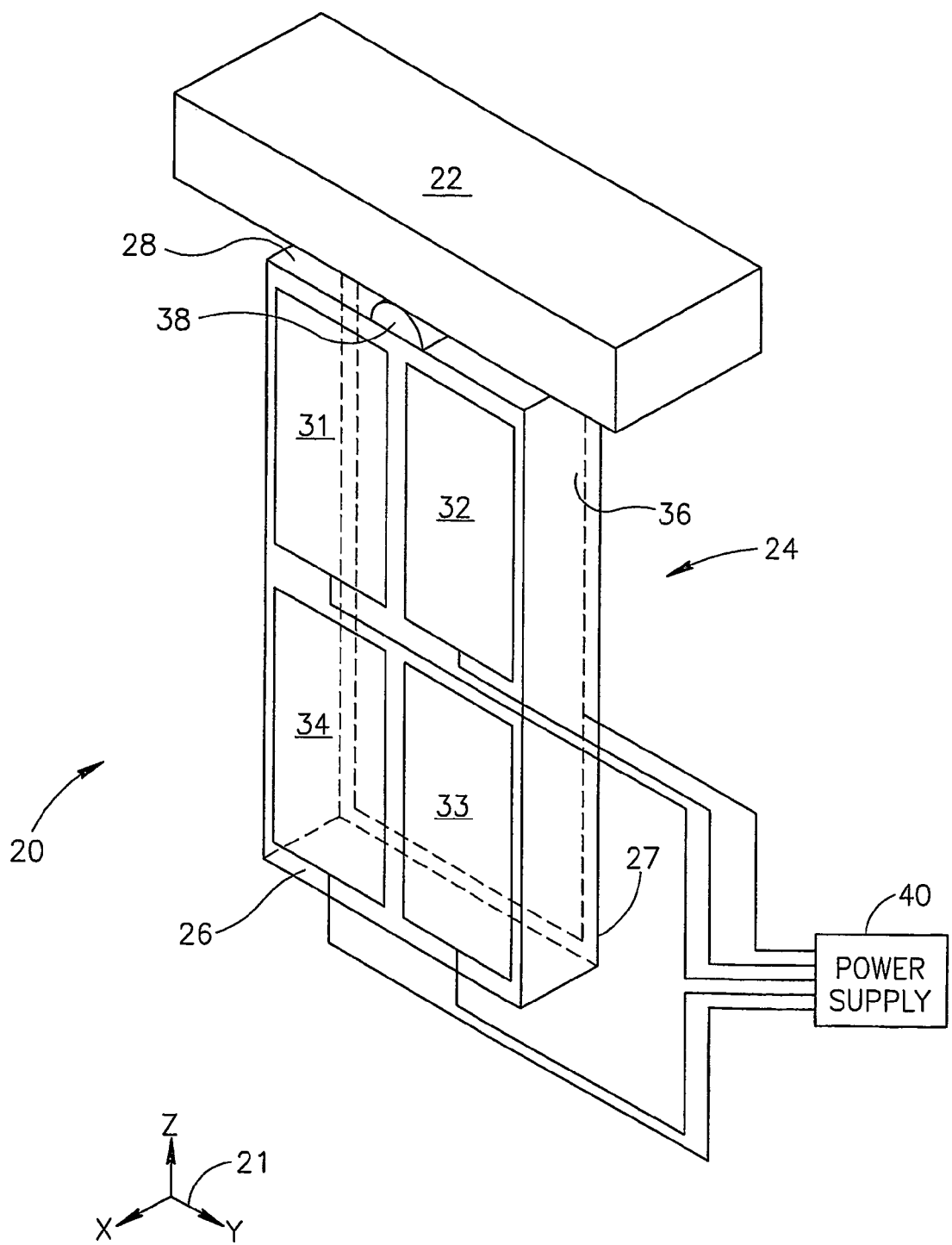
FIGS. 1A–1B schematically show a piezoelectric motor operating in a DC mode to move and accurately position a load at different substantially collinear locations, in accordance with an embodiment of the present invention.
Figure 1B:
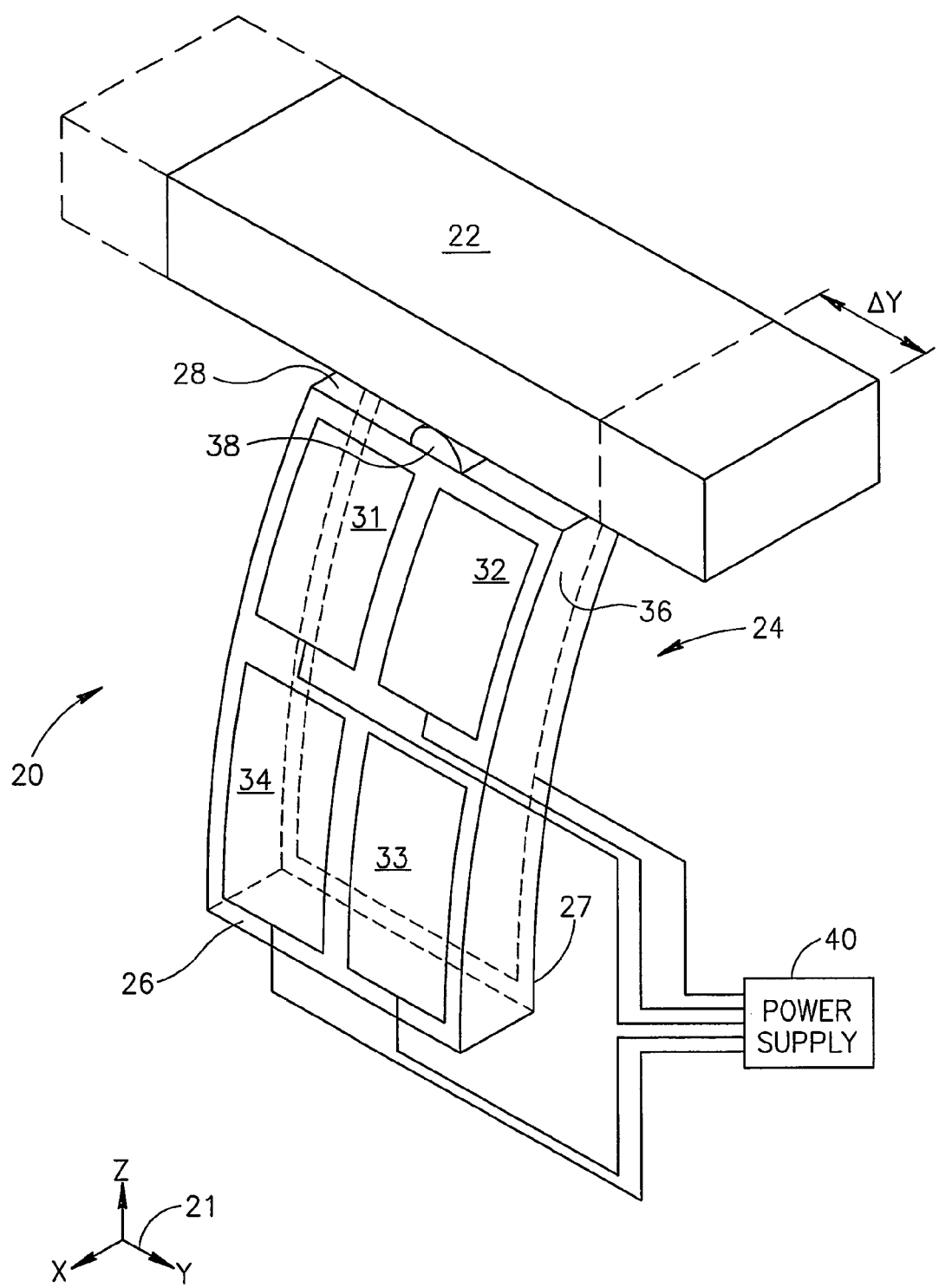

FIGS. 1A–1B schematically show a piezoelectric motor 20 coupled to a load 22 operating in a DC mode to position the load, in accordance with an embodiment of the present invention. Parts and features of piezoelectric motor 20 that are not normally seen in the perspective of FIGS. 1A–1B are shown with ghost lines. For convenience of presentation a coordinate system 21 is used to reference position and orientation of features of piezoelectric motor 20 and load 22 and directions germane to discussion of operation of the motor.

Piezoelectric motor 20 is similar in construction to a piezoelectric motor shown in U.S. Pat. No. 5,616,980 referenced above and optionally comprises a relatively thin piezoelectric vibrator 24 formed in the shape of a rectangular plate having large face surfaces 26 and 27. Face surface 26 optionally has four "quadrant" electrodes 31, 32, 33 and 34 mounted thereon, wherein each quadrant electrode covers substantially all of a different quadrant of surface 26. Surface 27 optionally has a single large electrode 36 mounted thereon. A friction nub 38 is optionally mounted on a short edge surface 28 of vibrator 24. Vibrator 24 is resiliently urged towards load 22 using any of various methods and apparatus known in the art so that friction nub 38 presses against load 22. Each electrode 31, 32, 33 and 34 is electrically connected to a power supply 40.

In accordance with an embodiment of the present invention, piezoelectric motor 20 has at least one AC mode of operation and at least one DC mode of operation. In an AC mode of operation, power supply 40 is controlled to electrify an appropriate configuration of electrodes comprising at least one quadrant electrode 31, 32, 33 and 34 relative to large electrode 36 with a time varying, optionally AC voltage to generate vibrations in the vibrator. The vibrations generate vibrations, usually elliptical, in friction nub 38 that step load 22 in either direction along the y-axis as required.

Any of various configurations of AC or time varying voltage known in the art may be used in an AC operation mode of piezoelectric motor 20 to generate appropriate vibratory motion of friction nub 38 to move load 22 as required. By way of example, U.S. Pat. No. 5,616,980 and U.S. application Ser. No. 09/980,375 describe various AC voltage configurations for generating vibrations in a vibrator similar to vibrator 24 and controlling motion of a load that may be used to generate vibrations in vibrator 24 and control motion of load 22. FIG. 1A schematically shows load 22 optionally after it has been positioned at a desired y-coordinate by piezoelectric motor 20 operating in an AC mode. In FIG. 1A, vibrator 24 has ceased vibrating and no voltage difference is applied between large electrode 36 and any of quadrant electrodes 31, 32, 33 and 34 by power supply 40. As a result, the shape of vibrator 40 is substantially rectangular and does not exhibit any left right asymmetry along the y-axis.

In a DC mode, power supply 40 applies a DC voltage difference between at least one quadrant electrode 31, 32, 33, 34 and large electrode 36 to cause vibrator 24 to bend substantially in its plane and displace friction nub 38 in the positive or negative y direction. The displacement of friction nub 38 displaces load 22. Magnitude and polarity of the DC voltage is determined responsive to the displacement required to position load 22 at the desired position. The voltage is maintained as long as it is required to maintain load 22 at the desired position.

Any of various DC modes of operation of piezoelectric motor 20 may be used, in accordance with an embodiment of the present invention, to displace and position load 22. For example, FIG. 1B schematically shows piezoelectric motor 20 operating in a DC mode, in accordance with an embodiment of the present invention, to displace load 22 by an amount $+\Delta y$ from the load's position shown in FIG. 1A. The displaced position of load 22 in FIG. 1B is shown in dashed lines.

Assume that piezoelectric plate 24 is polarized so that a positive voltage applied to a quadrant electrode 31, 32, 33, or 34 relative to large electrode 36 causes the material between the quadrant electrode and the large electrode to expand. Let $DC_i$ represent an "i-th" DC mode of operation, in accordance with an embodiment of the present invention. Let $V_i$ represent a positive voltage relative to electrode 36 that power supply 40 applies to a quadrant electrode 31, 32, 33 or 34 in mode $DC_i$ which displaces friction nub 38 and thereby load 22 by a distance $\Delta y$ along the y-axis. Then, by way of example, to displace load 22 by $\Delta y$, in accordance with an embodiment of the present invention, voltage may be applied to electrodes 30 31, 32, 33, 34 and 36 in the exemplary $DC_i$ modes of operation that are listed below. For each exemplary $DC_i$ mode listed, an electrode is electrified at a voltage indicated by an equal sign following the electrode number, the letter F indicates that the electrode is floating and the number 0 indicates that the electrode is grounded.

$DC_1$:(31,34=$V_1$; 32,33=$-V_1$; 36=0)
$DC_2$:(31,34=$V_2$; 32,33=F; 36=0)
$DC_3$:(31,33=$V_3$; 32,34=$-V_3$; 36=0)
$DC_4$:(31,33=$V_4$; 32,34=F; 36=0)
$DC_5$:(31,33=$V_5$; 32,34=0; 36=0).

The preceding list of exemplary DC modes is not exhaustive and other DC modes and variations of the DC modes listed will readily occur to a person of the art. For example, whereas in $DC_1$, voltage applied to electrodes 32 and 33 is opposite in polarity and equal in magnitude to that applied to electrodes 31 and 34, in some embodiments of the present invention, magnitude of voltage applied to electrodes 32 and 33 is different from that applied to electrodes 31 and 34. Each DC mode is defined with a voltage having a subscript that matches the subscript of the mode to indicate that for a same given displacement, magnitude of voltage applied to electrodes comprised in motor 20 may be different for different DC modes.

It is noted that piezoelectric motor 20 is optionally right left symmetric along the y-axis. As a result, a displacement of $-\Delta y$ may be provided by replacing each voltage used to provide a $+\Delta y$ displacement by its negative. Alternatively, a voltage configuration used to produce a $+\Delta y$ displacement may be replaced by its reflection in a plane parallel to the xz-plane and through the center of the motor to provide a $-\Delta y$ displacement.

The inventor has found that for a piezoelectric motor similar to piezoelectric motor 20 operating in a $DC_i$ mode of operation, in accordance with an embodiment of the present invention, displacements $\Delta y$ can often be controlled to resolution equal to or better than a small number of nanometers. In some embodiments of the present invention resolution is better than 5 nanometers. In some embodiments of the present invention resolution is better than 2 nanometers. In some embodiments of the present invention resolution is better than a nanometer. In some embodiments of the present invention for which displacement of a load is appropriately compensated for environmental disturbances such as vibrations and fluctuations of ambient temperature, displacements Δy are controllable to resolution better than 100 picometers. Whereas for a given $DC_i$ mode of operation, displacement Δy as a function of voltage $V_i$ follows a hysteresis curve, often the hysteresis curve is sufficiently narrow so that for some applications, and in a limited dynamic range, Δy may be considered to be substantially a linear function of $V_i$.

By way of numerical example, assume that a piezoelectric motor, in accordance with an embodiment of the present invention, similar to motor 20 comprises a vibrator 24 that is about 30 mm long, 7.5 mm wide, 2 mm, is formed from PZT. The inventor has found that for such a motor operating in $DC_4$ mode Δy increases or decreases by about 1 nanometer for each 0.8 volt increase or decrease respectively of $V_i$ and that Δy can be controlled to resolution equal to or better than 1 nanometer. Displacement Δy is a substantially linear function of voltage for $|Δy| \leq$ about 500 nanometers.

It is noted that whereas in the above example piezoelectric motor 20 comprises a single relatively thin rectangular vibrator 24, piezoelectric motors in accordance with an embodiment of the present invention may comprise vibrators different from vibrator 24. Such vibrators may for example, have shapes and/or electrode configurations different from that shown in FIGS. 1A and 1B.

For example, whereas quadrant electrodes 31–34 on face surface 26 of vibrator 24 shown in FIGS. 1A and 1B are all of the same size, in some embodiments of the present invention, electrodes on face surface 26 along one long edge of vibrator 24 are larger than electrodes along the other long edge. The difference in electrode size provides greater dynamic range in one direction along the y axis than in the other opposite direction. A piezoelectric vibrator similar to vibrator 24 may also have a number of electrodes on face surface 26 different from four. By way of another example, a piezoelectric motor, in accordance with an embodiment of the present invention, may comprise a multilayer vibrator, such as a multilayer vibrator similar to that shown in U.S. application Ser. No. 09/980,375. Other vibrators and electrode configurations suitable for the practice of the present invention will readily occur to a person of the art.

Whereas piezoelectric motor 20 displaces a load along a single axis, i.e. by way of example, the y-axis in FIGS. 1A and 1B, in some embodiments of the present invention a piezoelectric motor operating in a DC mode can displace a load along two orthogonal axes.

Figure 2A:
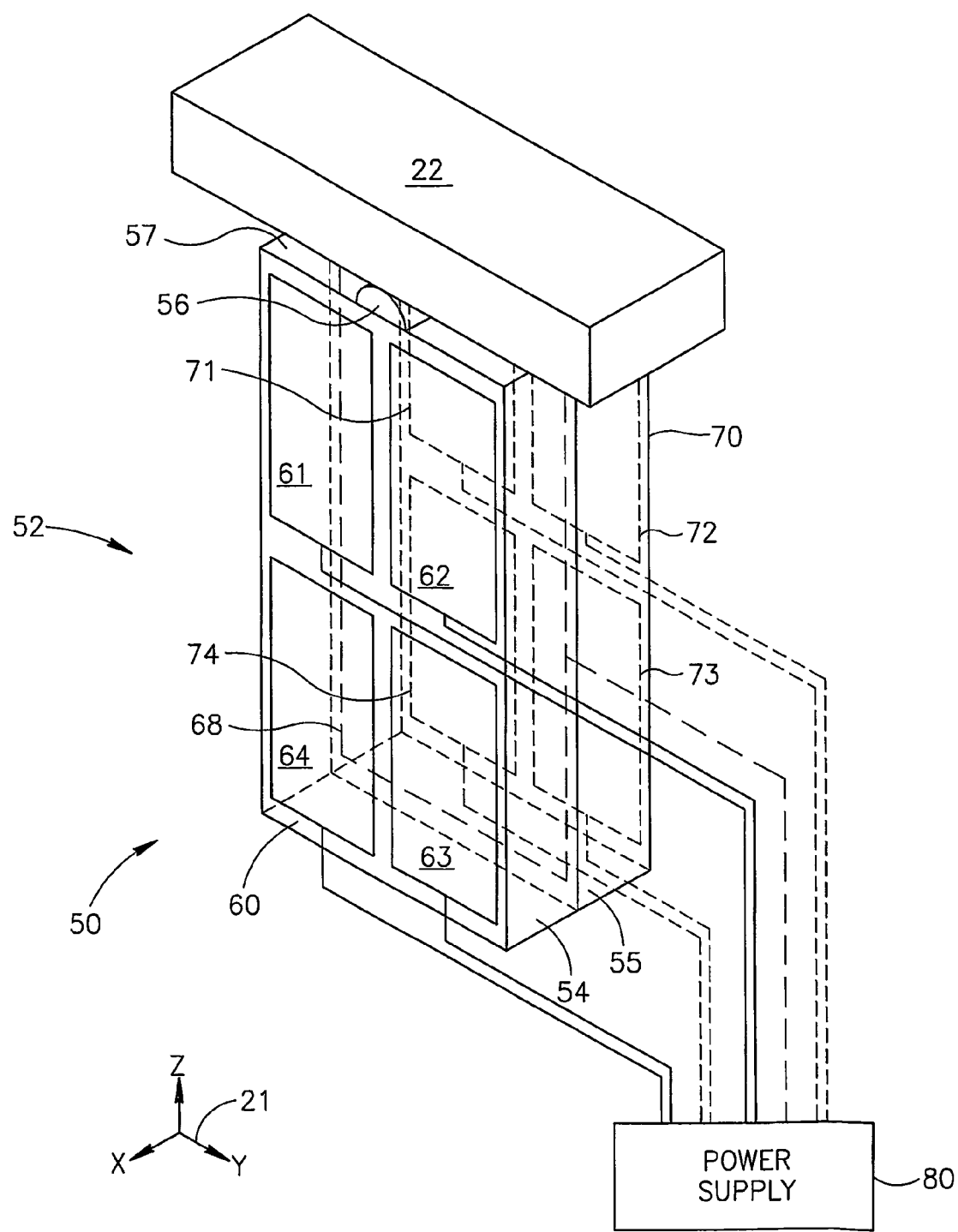
FIGS. 2A–2D schematically show another piezoelectric motor operating in a DC mode to move and accurately position a load at different non-collinear locations, in accordance with an embodiment of the present invention.
Figure 2B:
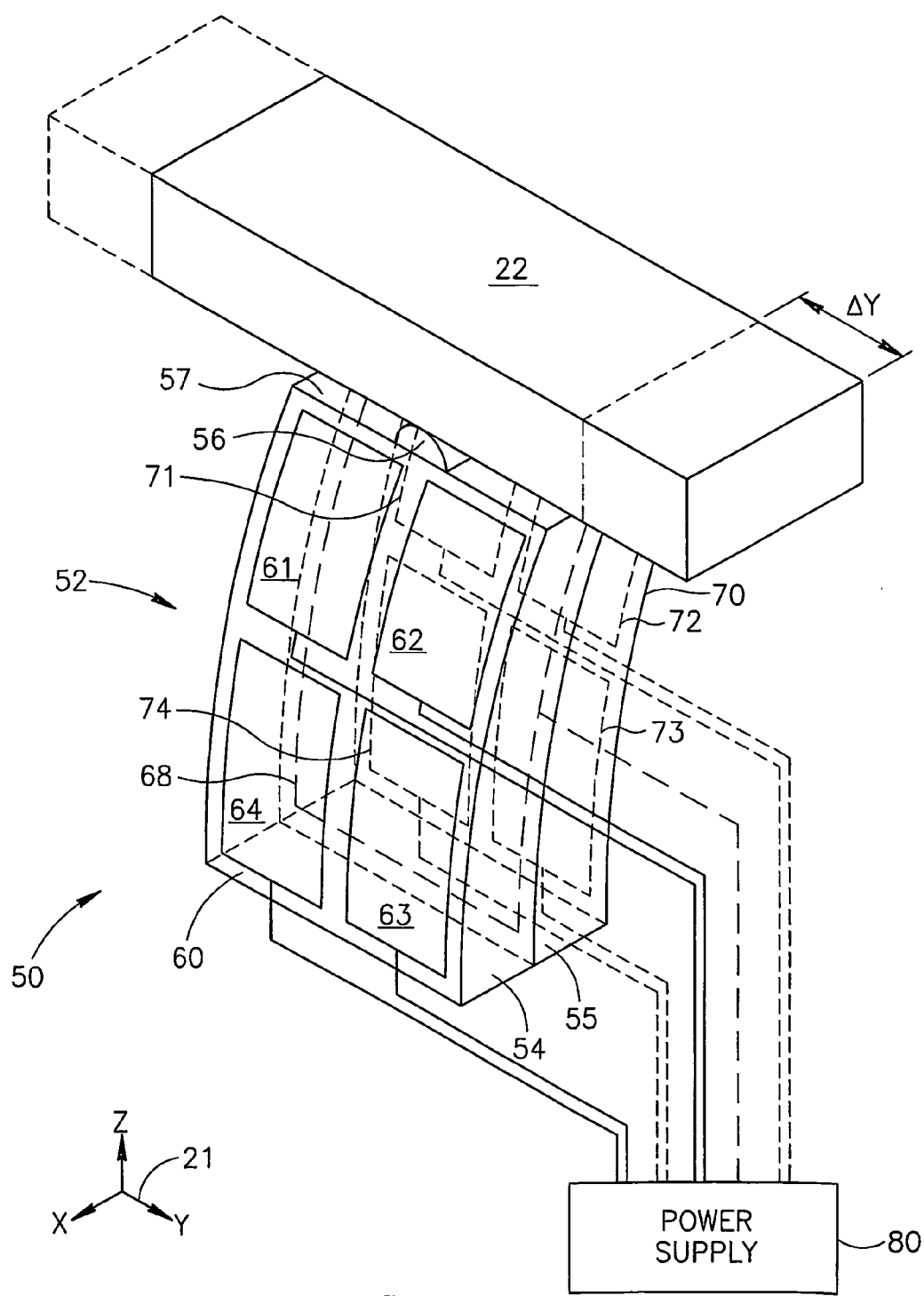
Figure 2C:
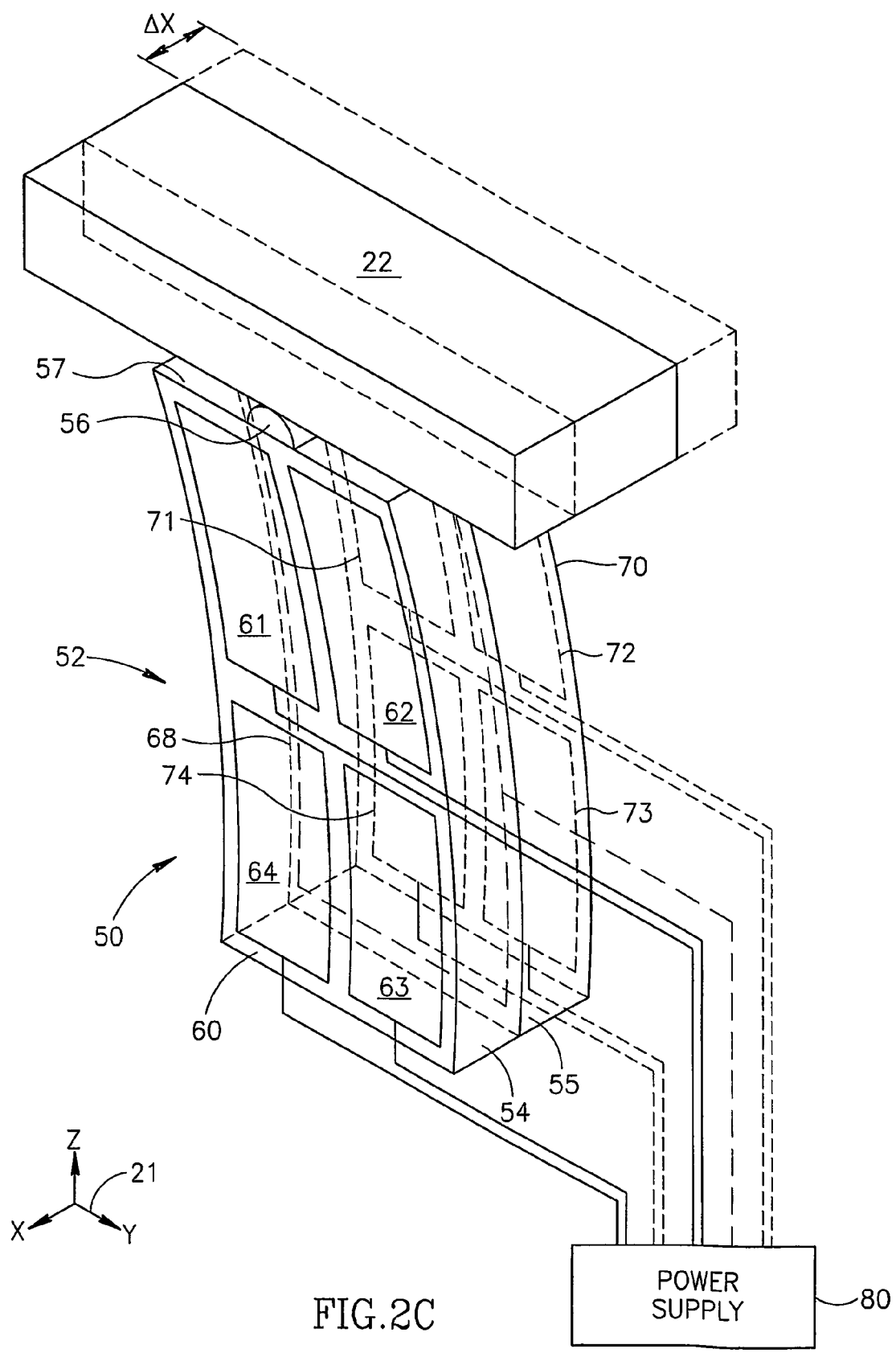

FIG. 2A–2C schematically show a piezoelectric motor 50, in accordance with an embodiment of the present invention, having DC modes operable to displace a load along either or both of two orthogonal axes. Piezoelectric motor 50 is, by way of example, a multilayer piezoelectric motor having a construction similar to a multilayer piezoelectric motor described in U.S. application Ser. No. 09/980,375, and is shown in FIGS. 2A–2C coupled to a load 22.

Piezoelectric motor 50 optionally comprises a multilayer vibrator 52 having two thin rectangular piezoelectric layers 54 and 55. Optionally, piezoelectric layers 54 and 55 are mirror images of each other. Four quadrant electrodes 61, 62, 63 and 64 are optionally located on a face surface 60. Four quadrant electrodes 71, 72, 73 and 74, which are optionally mirror images of electrodes 61, 62, 63 and 64 respectively, are optionally located on a face surface 70. A single large "intermediate" electrode 68 is optionally located between layers 54 and 55. A friction nub 56 is located on an edge surface 57. Optionally, piezoelectric layers 54 and 55 are polarized so that a positive voltage applied to any quadrant electrode relative to intermediate electrode 68 causes material between the quadrant electrode and the intermediate electrode to expand. The electrodes on vibrator 52 are connected to a power supply 80.

Piezoelectric motor 50 has AC modes of operation for moving load 22 along the x-axis and/or along the y-axis. For these AC modes of operation power supply 80 electrifies electrodes of vibrator 52 with AC voltage to generate appropriate vibrations in friction nub 56. Any of various different configurations of electrified electrodes on vibrator 52, such as configurations similar to those described in U.S. application Ser. No. 09/980,375 may be used in an AC mode of piezoelectric motor 50 to generate desired vibrations in friction nub 56. FIG. 2A shows piezoelectric motor 50 after the motor has positioned load 22 at a desired location along the x-axis and y-axis and power supply 80 has removed all voltage differences between electrodes on vibrator 52.

Piezoelectric motor 50 has DC modes, in accordance with embodiments of the present invention, for displacing load 22 along the x-axis and along the y-axis as required relative to the position of the load shown in FIG. 2A. Let an "i-th" DC mode of motor 52 that displaces load 22 along the y axis be represented $DCy_i$ and an i-th DC mode that displaces load 22 along the x axis be represented by $DCx_i$.

In a $DCy_i$ mode, mirror image electrodes on face surfaces 60 and 70 are optionally electrified with a same DC voltage relative to intermediate electrode 68, e.g. quadrant electrodes 61 and 71 are electrified to a same voltage relative to electrode 68. In addition, mirror electrode pairs on vibrator 52 are optionally electrified with DC voltage in configurations that are homologous to those of exemplary DC modes $DC_1$-$DC_5$ of motor 20 shown in FIGS. 1A and 1B to displace load 22 along the y-axis.

For example, quadrant electrodes on vibrator 52 may be electrified in a DC mode "$DCy_3$" homologous to DC mode $DC_3$ of motor 20 noted above to move load 22 a distance Δy. In $DCy_3$ therefore, intermediate electrode 68 would be grounded and quadrant electrode mirror image pairs would be electrified as follows: (61 & 71) and (63 & 73)=$V'_3$; (62 & 72) and (64 & 74)=$-V'_3$. Voltage $±V'_3$ applied to the electrode pairs is primed to indicate that for a same displacement Δy, voltage applied to motor 50 in mode $DCy_3$ is not necessarily the same as voltage $V_3$ applied to quadrant electrodes in mode $DC_3$ of motor 20. FIG. 2B schematically shows piezoelectric motor 50 optionally operating in a DC mode, optionally $DCy_3$, to displace load 22 by a distance Δy.

To displace load 22 along the x-axis, motor 50 may be operated, in an exemplary $DCx_i$ mode arbitrarily referred to as $DCx_1$, for which intermediate electrode 68 is grounded, quadrant electrodes 61, 62, 63 and 64 are electrified with a same voltage "V" and quadrant electrodes 71, 72, 73 and 74 are electrified to same voltage -V. If V is positive, the applied voltages will cause vibrator 52 to bend in the negative x direction and if V is negative the applied voltages will cause vibrator 52 to bend in the positive x direction. Friction nub 56 and load 22 will move accordingly.

By way of another example of a $DCx_i$ mode, electrodes 71, 72, 73 and 74 are floating, intermediate electrode 68 is grounded and electrodes 61, 62, 63 and 64 are electrified with a same positive or negative voltage to displace load 22 in the negative or positive x direction respectively. FIG. 2C schematically shows motor 50 operating in a $DCx_i$ mode to displace load 22 by a distance Δx in the positive x direction.

Figure 2D:
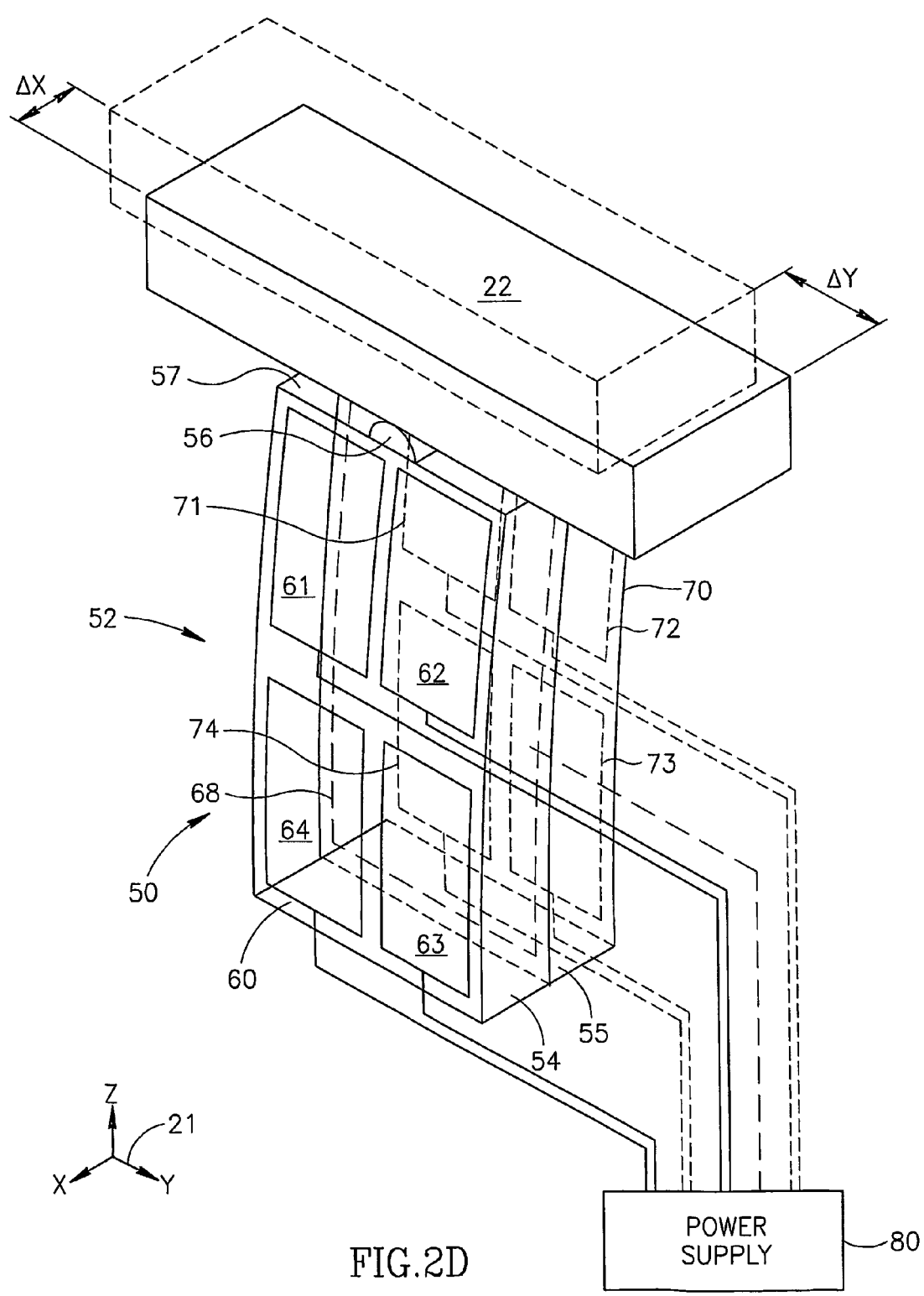

$DCx_i$ and $DCy_i$ modes respectively displace load 22 in the x and y directions. In accordance with an embodiment of the present invention, a $DCx_i$ mode and a $DCy_j$ mode are combined to provide a displacement of load 22 having a component along the x-axis and a component along the y-axis. $DCx_i$ and $DCy_i$ modes are combined by superposing their respective voltage configurations. For example, to displace load 22 along both the positive x direction and the positive y direction, mode $DCx_1$ may be combined with mode $DCy_3$. Differences in voltages between quadrant electrodes provided by $DCy_3$ would be superposed on biases of quadrant electrodes provided by $DCx_1$. FIG. 2D schematically shows piezoelectric motor 50 operating in a combined $DCx_i$ and $DCy_i$ mode to displace load 22 by a displacement $\Delta s$ having components $\Delta x$ and $\Delta y$.

For some applications an actuator may be required to displace a load by relatively small distances that are controlled to relatively high resolution to position the load. For such applications, an actuator, in accordance with an embodiment of the present innovation, may be advantageous. Such an actuator comprises a piezoelectric body having a plurality of electrodes and a coupling surface which is pressed to a load to friction couple the piezoelectric body to the load and a power supply that operates the actuator in only a DC mode or modes. In a DC mode, the power supply electrifies electrodes of the piezoelectric body with DC voltage to distort the shape of the piezoelectric body, e.g. bend or elongate the body. As the piezoelectric body is distorted, the coupling surface moves and drags the load to which it is pressed along with it.

In some embodiments of the present invention, the actuator comprises a piezoelectric body having a shape similar to that of vibrator 24 comprised in motor 20 shown in FIGS. 1A and 1B and operates to displace a load along a single direction. In some embodiments of the present invention, the actuator comprises a piezoelectric body having a shape similar to that of lo vibrator 52 comprised in motor 50 (FIGS. 2A–2D) and operates to displace a load along a first direction and/or along a second direction orthogonal to the first direction. In the description and claims of the present application, each of the verbs, "comprise" "include" and "have", and conjugates thereof, are used to indicate that the object or objects of the verb are not necessarily an exhaustive listing of members, components, elements or parts of the subject or subjects of the verb.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art. The scope of the invention is limited only by the following claims.

The invention claimed is:

1. A piezoelectric actuator for moving and positioning a load, the actuator comprising:
   a piezoelectric body having a plurality of electrodes and a coupling surface which is pressed to a load to friction couple the body to the load; and
   a power supply operable to electrify at least one electrode of the plurality of electrodes with DC voltage to displace the coupling surface and drag thereby the load to a desired position, which DC voltage the power supply maintains to maintain the load at the desired position.

2. A piezoelectric actuator according to claim 1 wherein displacements generated by the DC voltage applied by the power supply are substantially collinear.

3. A piezoeleclric actuator according to claim 1 wherein the DC voltage is controllable to generate displacements that are not collinear.

* * * * *